Figures 3, 4:
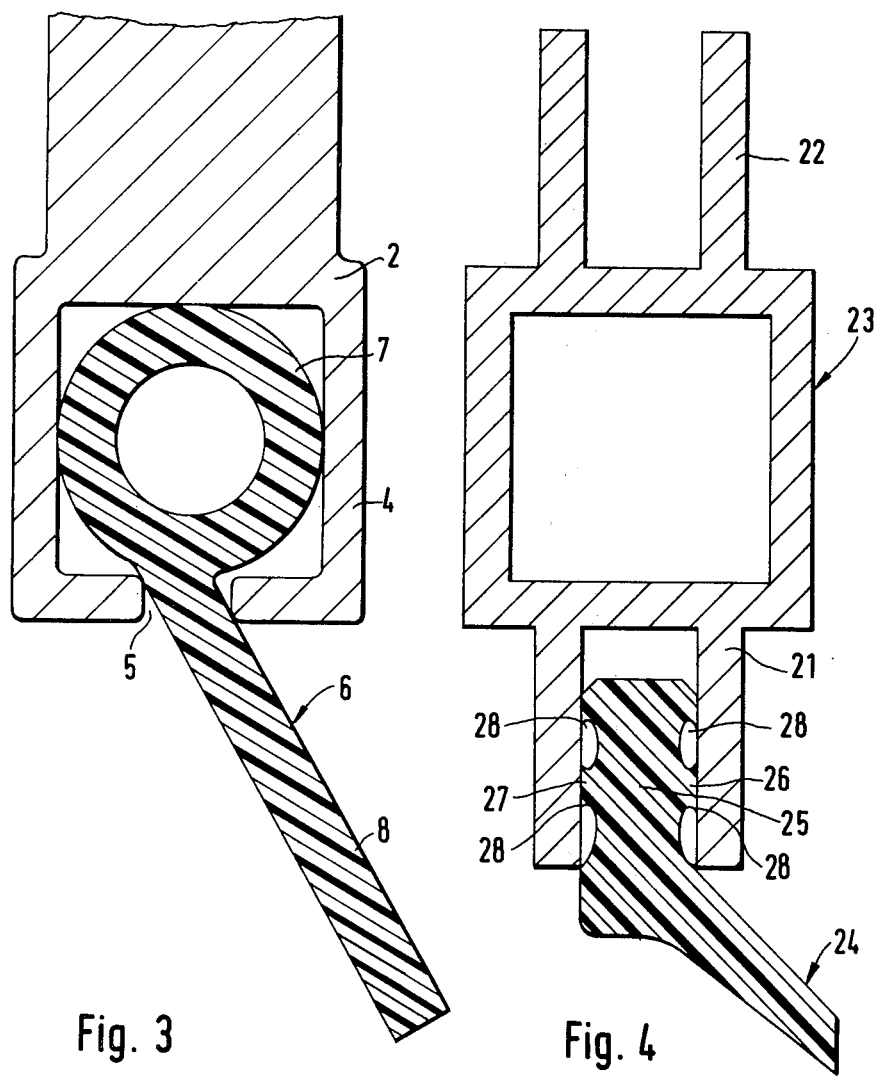

United States Patent [19]

Heist et al.

[11] 4,329,936

[45] May 18, 1982

[54] DOCTOR BLADE DEVICE IN AUTOMATIC PROCESSORS FOR PRINTING PLATES

[75] Inventors: Hans Heist; Dieter Töpfer, both of Wiesbaden, Fed. Rep. of Germany

[73] Assignee: Hoechst Aktiengesellschaft, Fed. Rep. of Germany

[21] Appl. No.: 218,385

[22] Filed: Dec. 19, 1980

Related U.S. Application Data

[63] Continuation of Ser. No. 970,155, Dec. 18, 1978, abandoned.

[30] Foreign Application Priority Data

Dec. 21, 1977 [DE] Fed. Rep. of Germany ....... 2756932

[51] Int. Cl.$^3$ ............................................. B05C 11/02
[52] U.S. Cl. ................................... 118/100; 101/120; 101/123; 101/124; 101/157; 101/169
[58] Field of Search ............... 101/120, 123, 124, 365, 101/157, 169, 350; 15/256.5, 256.51; 118/213, 123, 126, 413, 100

[56] References Cited

U.S. PATENT DOCUMENTS

| | | | |
|---|---|---|---|
| 2,066,780 | 1/1937 | Holt | 118/126 |
| 2,163,712 | 6/1939 | Shearer | 118/123 |
| 2,498,917 | 2/1950 | Gattuso | 101/124 |
| 2,665,660 | 1/1954 | Olden | 118/126 |
| 3,685,085 | 8/1972 | Jaffa | 101/120 |
| 4,070,964 | 1/1978 | Vestegaal | 101/120 |

Primary Examiner—Michael R. Lusignan
Assistant Examiner—Richard Bueker
Attorney, Agent, or Firm—James E. Bryan

[57] ABSTRACT

This invention relates to an improvement in a doctor blade device adapted for use in an automatic processor for printing plates, comprising at least one doctor blade made of a flexible material and being detachably mounted in a guide bar, and holding means for attaching the doctor blade to two side plates of the printing plate processor, the improvement comprising means connecting the guide bar with a carrier bar each end of which is adapted to be inserted from above into a channel section having an upwardly pointing opening and having two arms spaced by a web; means securing each channel section by its web to a side plate in such a manner that its two arms extend transversely to the transport direction of a printing plate in the direction of the interior of the printing plate processor; and support means at both ends of the upper surface of the carrier bar whereby the carrier bar together with the connected guide bar and the doctor blade rest upon said channel sections.

4 Claims, 4 Drawing Figures

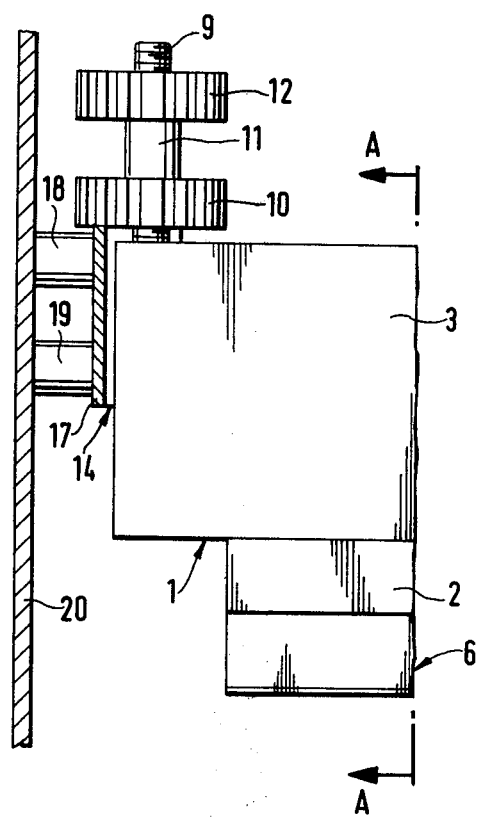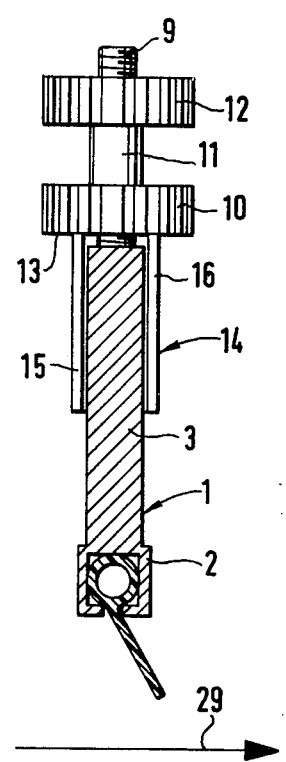
Fig. 2                    Fig. 1

DOCTOR BLADE DEVICE IN AUTOMATIC PROCESSORS FOR PRINTING PLATES

This is a continuation of application Ser. No. 970,155, filed Dec. 18, 1978, now abandoned.

This invention relates to a doctor blade device in automatic processors for printing plates, comprising at least one doctor blade made of a flexible material and detachably mounted in a guide bar, and further comprising holding means for attaching the doctor blade to two side plates of the printing plate processor.

In a prior art doctor blade device of this kind a narrow rubber strip cut to size is used as a doctor blade. The guide bar is composed of a channel section bent from a sheet metal strip. The doctor blade is inserted into this channel section, whereupon the arms of the channel section are pressed together. In addition, the doctor blade is bolted to the channel section at locations spaced with respect to one another. Because this guide bar is not inherently stable, even when carrying the doctor blade, it is bolted to a blade support of a carrier bar. This blade support, in turn, must be bolted to the machine by means of securing elements.

It is a disadvantage of this known doctor blade device that replacing the doctor blade is comparatively complicated and can be done only by using tools. To effect this, the carrier bar must be first dismounted, then the channel section carrying the rubber strip must be completely detached, then the screws fastening the rubber strip to the guide bar must be removed and, finally, the rubber strip can be replaced. Frequently, this work and the ensuing assembly cannot be performed by the user of the machine, but only by trained servicing personnel. It is particularly difficult to replace the narrow rubber strip constituting the doctor blade, because this strip deforms when it is clamped into the guide bar, especially at the locations of the screw fastenings, due to the softeness of the doctor blade rubber, so that the straightness of the stripping edge of the doctor blade is no longer ensured. Consequently, it is often necessary to trim the stripping edge of the doctor blade after the rubber strip has been clamped into the guide bar.

Another previously proposed device (U.S. Pat. No. 3,983,758) serves to fasten a sponge in an automatic processor for offset printing plates. This device varies in type from the doctor blade device according to the present invention, insofar as the function of the sponge differs from that of the doctor blade. The sponge is adapted to perform a reciprocating motion on the printing plate, transversely to the direction of travel of the plate. On the plate-feeding side of the printing plate processor the reciprocating sponge serves to rub developer solution over the printing plate. On the plate-discharging side, on the other hand, the sponge is used to rub washing water over the printing plate. The required reciprocating motion of the sponge is obtained by means of a sponge bar supporting a channel which opens downwardly and into which the sponge is inserted, with the sponge bar projecting from a side plate of the printing plate processor, so that the protruding end can be coupled with a crank drive. At the point where the sponge bar projects from the side plate, the latter is reinforced by two slide blocks each, disposed adjacent to an opening into which the sponge bar may be placed from above. The slide blocks guide the sponge bar in the direction of the reciprocating motion transversely to the direction of travel of the printing plate. Further, the known device is provided with adjustable pressure means at each end where the sponge bar projects from a side plate, so that an additional frictional pressure may be effected at each sponge. This is achieved by a Z-shaped arm carrying, at one end, a rotatably mounted roller which is adapted to roll over the upper surface of the sponge bar, whereas the opposite end of the Z-shaped pressure arm is adjustably fastened to blocks connected with the side plate. Depending upon the level at which this end is fastened to the blocks, the roller mounted on the opposite end of the arm exerts a different pressure upon the printing plate, in addition to the weight of the sponge bar and the parts connected therewith.

It is, however, not possible simply to apply the construction of this sponge device to a doctor blade device, because the doctor blade should be stationarily mounted in the printing plate processor, and the contact pressure of the doctor blade on the printing plate must be dimensioned differently to the frictional pressure exerted by the sponge.

In consideration of the disadvantages of the known doctor blade device, it is an object of the present invention to provide a doctor blade device in which the guide bar carrying the doctor blade and the doctor blade itself may be quickly removed from the printing plate processor without the use of tools, and then may be cleaned or, if necessary, replaced.

In one embodiment of the device, the guide bar together with the attached carrier bar and the doctor rubber may be simply withdrawn upwardly from the side plates of the printing plate processor without having to detach any connection, when the doctor blade device has to be cleaned or repaired. Re-installation into the machine of the guide bar together with the carrier bar and the doctor blade inserted into the guide bar is just as easy. The support means provided on the upper surface at each end of the carrier plate then rest on channel sections fastened to the two side plates, thus preventing that the entire weight of the unit made up of the guide bar, the carrier bar and the doctor blade lies on the printing plate at the lip of the doctor blade. The unit made up of the guide bar, the carrier bar and the doctor blade is stationarily mounted in the printing plate processor. For this purpose, the guide bar is, in an inexpensive but reliable manner, held at both ends in the channels and is thus secured against any displacement in the transport direction and opposite to the transport direction, as well as against any displacement transversely to the printing plate. The expenditure for the manufacture of this doctor blade device also can be kept low, because the guide bar and the carrier bar may be formed from semi-finished sections.

Further, the doctor blade device appropriately has the feature that the support means are adjustably fastened to the carrier plate, so that it is possible to regulate the distribution of the weight which the carrier bar including the guide bar and the doctor blade exert, on the one hand, upon the line of contact of the doctor blade on the printing plate and, on the other hand, upon the two channel sections.

In a favorable manner, in view of doctoring, a weight component supported by the channel sections is here separated from the total weight of the unit made up of the guide bar, the carrier bar and the doctor blade, so that the remaining weight component exerts pressure only upon the printing plate through the lip of the doctor blade. This pressure thus can be easily adjusted in such a manner that the liquid is cleanly removed from the surface of the printing plate, however, without damaging the mechanically sensitive surface of the plate.

In a further embodiment of the doctor blade device the adjustable support means preferably have the feature that a first knurled nut which is provided at each end of the carrier plate is screwed on a threaded bolt inserted in the carrier plate and may be locked by a second knurled nut.

In this embodiment of the device the bottom side of the first knurled nut preferably rests on the two arms and also on the web of the channel section. Depending upon how far this knurled nut is turned downwardly on the threaded bolt, the upper end of the doctor blade, namely the head strip of the doctor blade, is raised more or less with respect to the printing plate, so that the lip of the doctor blade exerts an adjustable pressure upon the printing plate. The appropriate position of the first knurled nut and the contact pressure obtained thereby is maintained in a simple manner by locking the second knurled nut.

In a preferred embodiment of the doctor blade device the guide bar and the carrier bar are made in one piece.

The unit of guide bar and carrier bar constituted by a single extruded shape has the advantage of a particularly low mounting expenditure over a two-piece design of the guide bar and the carrier bar, which must be assembled.

An advantageous alternative embodiment of the doctor blade device has the features that the guide bar is inherently stable and has a U-shaped cross-section which opens downwardly, and that a doctor rubber which may be laterally inserted into the guide bar has a head strip of an approximately rectangular cross-section, with barbs extending lengthwise and being formed on two parallel side faces of the head strip.

Because the barbs bend back when the doctor rubber is laterally inserted into the U-shaped guide bar, a comparatively small effort is required for insertion of the rubber; on the other hand, however, the rubber is securely held in the U-shaped cross-section of the guide bar by means of the barbs. It is, therefore, not necessary to deform the U-shaped cross-section of the guide bar to secure the doctor rubber.

In a second embodiment of the doctor blade device, the guide bar is inherently stable and has an approximately box-shaped section with a longitudinal slot at the bottom, the doctor rubber has a head strip of an approximately annular cross-section, from which a lip of the doctor blade extends downwardly, and the lip of the doctor blade projects from the longitudinal slot in the box-shaped section.

The advantages of this embodiment of the doctor blade device are the same as those of the afore-described doctor blade device. It has, however, the additional advantages that the doctor rubber may be particularly easily introduced laterally into the guide bar with the head strip being compressed thereby and that, on the other hand, the doctor rubber is particularly reliably secured from being pulled out downwardly or in the transport direction of the printing plate, because the head strip is safely held by the parts of the section adjacent to the longitudinal slot.

In the two embodiments described the doctor rubber is appropriately an extruded piece made of silicone rubber.

Below, the invention is explained in more detail by reference to the accompanying drawings including four figures, in which:

FIG. 1 is a cross-sectional view of the doctor blade device, viewed in the direction of a side plate of a printing plate processor, FIG. 2 is a front view of a section of the doctor blade device in the area of a side plate, FIG. 3 shows a first embodiment of the guide bar and the doctor rubber in an enlarged cross-sectional detail, and FIG. 4 shows a second embodiment of the guide bar and the doctor rubber in an enlarged cross-sectional detail.

FIG. 2 is a detail of a nut 1 with an elongate guide bar and carrier bar. FIG. 1 depicts a section A—A in FIG. 2.

In the unit 1 the lower part 2 represents the guide bar and the contiguous upper part 3 the carrier bar. This unit is formed from an extruded shape made of aluminum. The lower part corresponding to the guide bar 2 is shown in FIG. 3. This part corresponding to the guide bar 2 has a box-shaped section 4 which is interrupted by a longitudinal slot 5 at the bottom.

A doctor rubber 6 which is inserted into the box-shaped section has a head strip 7 of an approximately annular cross-section. The doctor rubber extends downwardly to form a lip 8.

As may be seen from FIGS. 1 and 2, a threaded bolt 9 is inserted in the upper surface at one end of the upper part of the unit 1, which constitutes the carrier bar. A second threaded bolt corresponding to this threaded bolt 9 is provided at the opposite end of the unit 1, not shown in the drawing; as in fact the entire right-hand side of the unit, which is not represented in the drawing, conforms to the left-hand side shown.

A lower knurled nut 10 is screwed on the threaded bolt 9 and is separated by a spacer 11 from an upper knurled nut 12 which serves as a lock nut.

As may be seen from FIGS. 1 and 2, the underside 13 of the lower knurled nut rests upon a channel section 14. In FIG. 1 two parallel arms 15 and 16 of the channel section 14 are shown, which are separated by the web 17 depicted in FIG. 2. The web is fastened to a side plate 20 by means of the bolts 18 and 19.

The doctor blade device is manufactured in such a manner that the doctor rubber 6 is first introduced into the box-shaped section normal to the plane of the drawing, with the unit 1 being detached from the printing plate processor. Then the entire unit 1 is inserted from above into the two channel sections, so that the lip 8 of the doctor rubber comes into contact with the printing plate or the bottom of the printing plate processor, respectively. The contact pressure of the lip 8 is varied by adjusting the height of the unit 1 with the aid of the lower knurled nut 10. When the correct position has been reached, the upper knurled nut 12 is tightened with respect to the lower knurled nut, thus locking its vertical position.

In the second embodiment of the doctor blade device shown in FIG. 4 the guide bar 21 also forms a single piece unit 23 together with the carrier bar 22, and it has a U-shaped opening facing downwardly. A doctor rubber 24 may be inserted laterally, i.e. normal to the plane of the drawing, into the guide bar 21. The doctor rubber has an approximately rectangular head strip 25. Barbs 28 are formed on the parallel longitudinal sides 26 and 27 of the head strip, which ensure that the doctor rubber is securely held in the channel section.

It will be obvious to those skilled in the art that many modifications may be made within the scope of the present invention without departing from the spirit thereof, and the invention includes all such modifications.

What is claimed is:

1. In a doctor blade device in an automatic processor for printing plates, comprising at least one doctor blade made of a flexible material and being detachably mounted in a guide bar, and holding means for attaching the doctor blade to two side plates of the printing plate processor, the improvement comprising an integral guide bar and carrier bar each end of which is adapted to be inserted from above into a rectangular channel section having an upwardly pointing opening and having two arms spaced by a web, means securing each channel section by its web to a side plate in such a manner that its two arms extend transversely to the transport direction of a printing plate in the direction of the interior of the printing plate processor, support means at both ends of the upper surface of the carrier bar whereby the carrier bar together with the integral guide bar and the doctor blade rest upon said channel sections, means adjustably mounting the support means on the carrier bar, whereby the distribution of the weight exerted by the carrier bar together with the guide bar and the doctor blade on the one hand, upon the line of contact of the doctor blade of the printing plate, and, on the other hand, upon the two channel sections in regulatable, and wherein said support means includes a first knurled nut at each end of the carrier bar, which is screwed on a threaded bolt inserted in the carrier bar and which is locked by a second knurled nut.

2. A doctor blade device as claimed in claim 1 wherein said guide bar is inherently stable and has a U-shaped cross-section which opens downwardly, and means whereby the doctor blade may be laterally inserted into the guide bar, said blade having a head strip of rectangular cross-section with longitudinal barbs on two parallel lateral surfaces thereof, said adjustable support means including spacer means separating the first and the second nuts, and said first nut resting on upper edges of the two arms of the channel sections.

3. A doctor blade device as claimed in claim 1 wherein the guide bar is inherently stable and has an approximately box-shaped section with a longitudinal slot at the bottom, said doctor blade being inserted in said box-shaped section and having a head strip of an approximately annular cross-section from which a lip of the doctor blade extends slopingly downwardly, and wherein the lip of the doctor blade projcts outwardly from the longitudinal slot in the box-shaped section.

4. A doctor blade device as claimed in claim 3 wherein the doctor blade is an extruded piece made of silicone rubber.

* * * * *